(12) United States Patent
Hur et al.

(10) Patent No.: US 12,396,108 B2
(45) Date of Patent: Aug. 19, 2025

(54) ELECTRONIC DEVICE COMPRISING FLEXIBLE DISPLAY

(71) Applicant: Samsung Electronics Co., Ltd., Suwon-si (KR)

(72) Inventors: Juneyoung Hur, Suwon-si (KR); Bongjae Kim, Suwon-si (KR); Sihoon Youm, Suwon-si (KR); Jongdae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 18/318,373

(22) Filed: May 16, 2023

(65) Prior Publication Data

US 2023/0292454 A1   Sep. 14, 2023

Related U.S. Application Data

(63) Continuation of application No. PCT/KR2021/016772, filed on Nov. 16, 2021.

(30) Foreign Application Priority Data

Nov. 16, 2020 (KR) .................. 10-2020-0152883
May 18, 2021 (KR) .................. 10-2021-0064116

(51) Int. Cl.
*H05K 5/02* (2006.01)
*H05K 5/00* (2006.01)

(52) U.S. Cl.
CPC ......... *H05K 5/0217* (2013.01); *H05K 5/0086* (2013.01)

(58) Field of Classification Search
CPC . H05K 5/0217; H05K 5/0086; H04M 1/0277; H04M 1/0235; H04M 1/0262; H04M 1/0268; G09F 9/301; G06F 1/1652
See application file for complete search history.

(56) References Cited

U.S. PATENT DOCUMENTS 10,537,026 B2 *  1/2020  Shin .................... H05K 5/0017
10,880,635 B2 * 12/2020  Zuo ........................ H04R 1/08
(Continued)

FOREIGN PATENT DOCUMENTS

JP        2015-036994 A    2/2015
KR   10-2016-0011718 A    2/2016
(Continued)

OTHER PUBLICATIONS

International Search Report dated Feb. 18, 2022, issued in International Patent Application No. PCT/KR2021/016772.
(Continued)

*Primary Examiner* — Sagar Shrestha
(74) *Attorney, Agent, or Firm* — Jefferson IP Law, LLP

(57) ABSTRACT

An electronic device is provided. The electronic device includes a cover, a flexible display having at least a portion arranged inside the cover, a roller which is arranged inside the cover and ensures that at least the portion of the flexible display is rolled, a bracket which is arranged inside the cover and configured to cover at least the portion of the flexible display, a battery disposed between the cover and the bracket, and a flexible printed circuit board (FPCB) which is connected to the battery and arranged at one side of the battery, wherein the FPCB may be electrically connected to a display driving circuit of the flexible display, the display driving circuit being arranged in the roller.

19 Claims, 18 Drawing Sheets

(56) References Cited

U.S. PATENT DOCUMENTS

| | | | |
|---|---|---|---|
| 11,343,365 B2* | 5/2022 | Zuo | H04M 1/0268 |
| 2011/0203754 A1* | 8/2011 | Mullet | E06B 9/72 |
| | | | 318/446 |
| 2012/0050075 A1* | 3/2012 | Salmon | G06F 1/1626 |
| | | | 361/679.01 |
| 2013/0127799 A1* | 5/2013 | Lee | G06F 1/1652 |
| | | | 345/204 |
| 2015/0047796 A1 | 2/2015 | Peng et al. | |
| 2016/0132281 A1 | 5/2016 | Yamazaki et al. | |
| 2017/0033327 A1* | 2/2017 | Tajima | H01M 50/119 |
| 2017/0060183 A1 | 3/2017 | Zhang et al. | |
| 2017/0168575 A1* | 6/2017 | Kasahara | G06F 3/016 |
| 2017/0196102 A1 | 7/2017 | Shin et al. | |
| 2017/0196103 A1 | 7/2017 | Cho | |
| 2017/0212607 A1* | 7/2017 | Yoon | G06F 3/147 |
| 2017/0325342 A1 | 11/2017 | Lee | |
| 2017/0329368 A1 | 11/2017 | Rho | |
| 2018/0103551 A1* | 4/2018 | Park | H05K 5/0217 |
| 2018/0210559 A1* | 7/2018 | Xia | H04M 1/72409 |
| 2018/0210560 A1 | 7/2018 | Xia et al. | |
| 2018/0341290 A1* | 11/2018 | Sim | G06F 1/1658 |
| 2019/0138058 A1 | 5/2019 | Kwon et al. | |
| 2020/0022268 A1 | 1/2020 | Zuo | |
| 2021/0051809 A1* | 2/2021 | Song | G06F 1/1652 |
| 2021/0227709 A1* | 7/2021 | Sim | G06F 1/1652 |
| 2022/0183172 A1* | 6/2022 | Shim | H01Q 9/16 |
| 2022/0291829 A1* | 9/2022 | Kim | G06F 3/0412 |
| 2022/0346253 A1* | 10/2022 | Luo | H05K 5/0217 |
| 2023/0199980 A1* | 6/2023 | Jiang | G06F 1/1652 |
| | | | 361/807 |

FOREIGN PATENT DOCUMENTS

| | | |
|---|---|---|
| KR | 10-2016-0048690 A | 5/2016 |
| KR | 10-2016-0081786 A | 7/2016 |
| KR | 10-2017-0081345 A | 7/2017 |
| KR | 10-2017-0082548 A | 7/2017 |
| KR | 10-2017-0089664 A | 8/2017 |
| KR | 10-2017-0126069 A | 11/2017 |
| KR | 10-2017-0136951 A | 12/2017 |
| WO | 2007/072234 A1 | 6/2007 |

OTHER PUBLICATIONS

Extended European Search Report dated Mar. 15, 2024, issued in European Patent Application No. 21892408.2.

* cited by examiner

ELECTRONIC DEVICE COMPRISING FLEXIBLE DISPLAY

CROSS-REFERENCE TO RELATED APPLICATION(S)

This application is a continuation application, claiming priority under § 365(c), of an International application No. PCT/KR2021/016772, filed on Nov. 16, 2021, which is based on and claims the benefit of a Korean patent application number 10-2020-0152883, filed on Nov. 16, 2020, in the Korean Intellectual Property Office, and of a Korean patent application number 10-2021-0064116, filed on May 18, 2021, in the Korean Intellectual Property Office, the disclosure of each of which is incorporated by reference herein in its entirety.

BACKGROUND

1. Field

The disclosure relates to an electronic device including a flexible display. More particularly, the disclosure relates to providing increased user convenience by minimizing the size of an electronic device and maximizing the capacity of a battery.

2. Description of Related Art

Owing to the remarkable development of information and communication technology and semiconductor technology, various electronic devices have been increasingly proliferated and used. Especially, electronic devices are under development for use in communication while being carried.

An electronic device may refer to a device performing a specific function according to a loaded program, such as a home appliance, an electronic notebook, a portable multimedia player, a mobile communication terminal, a tablet personal computer (PC), a video/audio device, a desktop/laptop computer, or a car navigation device. For example, these electronic devices may output stored information as sound or an image. As the integration degree of electronic devices increases and ultra-high-speed, large-capacity wireless communication becomes commonplace, a single electronic device, such as a mobile communication terminal may be equipped with various functions. For example, not only a communication function but also an entertainment function, such as games, a multimedia function, such as music/video playback, a communication and security function, such as mobile banking, schedule management, and an electronic wallet function are integrated into one electronic device. Such electronic devices are miniaturized so that users may conveniently carry them.

As mobile communication service extends to the multimedia service area, the size of a display may increase in an electronic device to enable a user to sufficiently use multimedia service as well as voice calls or short messages. Accordingly, a rollable flexible display may be disposed in an area of a slidably separated housing.

The above information is presented as background information only to assist with an understanding of the disclosure. No determination has been made, and no assertion is made, as to whether any of the above might be applicable as prior art with regard to the disclosure.

SUMMARY

In an electronic device including a flexible display, a rollable flexible display may be disposed inside a housing, and thus the size of a space occupied by the flexible display in the housing may increase. The resulting increase in the size of the electronic device including the flexible display may deteriorate user convenience. Although the capacity of a battery may be reduced to minimize the size of the electronic device including the flexible display, the decreased capacity of the battery may decrease the use time of the electronic device, thereby deteriorating the user convenience.

Aspects of the disclosure are to address at least the above-mentioned problems and/or disadvantages and to provide at least the advantages described below. Accordingly, an aspect of the disclosure is to provide increased user convenience by minimizing the size of an electronic device and maximizing the capacity of a battery.

Additional aspects will be set forth in part in the description which follows and, in part, will be apparent from the description, or may be learned by practice of the presented embodiments.

In accordance with an aspect of the disclosure, an electronic device is provided. The electronic device includes a cover, a flexible display at least partially disposed inside the cover, a roller disposed inside the cover and configured to wind at least portion of the flexible display therearound, a bracket disposed inside the cover and configured to surround at least portion of the flexible display, a battery disposed between the cover and the bracket, and a flexible printed circuit board (FPCB) connected to the battery and disposed on one side of the battery. The FPCB may be electrically connected to a display driving circuit of the flexible display, disposed on the roller.

In accordance with another aspect of the disclosure, an electronic device is provided. The electronic device includes a cover, a flexible display at least partially disposed inside the cover, a roller disposed inside the cover and configured to wind at least portion of the flexible display therearound, a bracket disposed inside the cover and configured to surround at least portion of the flexible display, a pouch-shaped battery disposed between the cover and the bracket, and an FPCB connected to the pouch-shaped battery and disposed on one side of the pouch-shaped battery. The FPCB may be electrically connected to a display driving circuit of the flexible display, disposed on the roller.

An electronic device according to various embodiments of the disclosure may efficiently utilize its internal space because a battery is disposed inside a cover of a flexible display module. In addition, as the battery is disposed inside the cover of the flexible display module, the capacity of the battery may be maximized, thereby increasing the use time of the electronic device.

An electronic device according to various embodiments of the disclosure may increase user convenience by increasing its battery use time without increasing its size.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
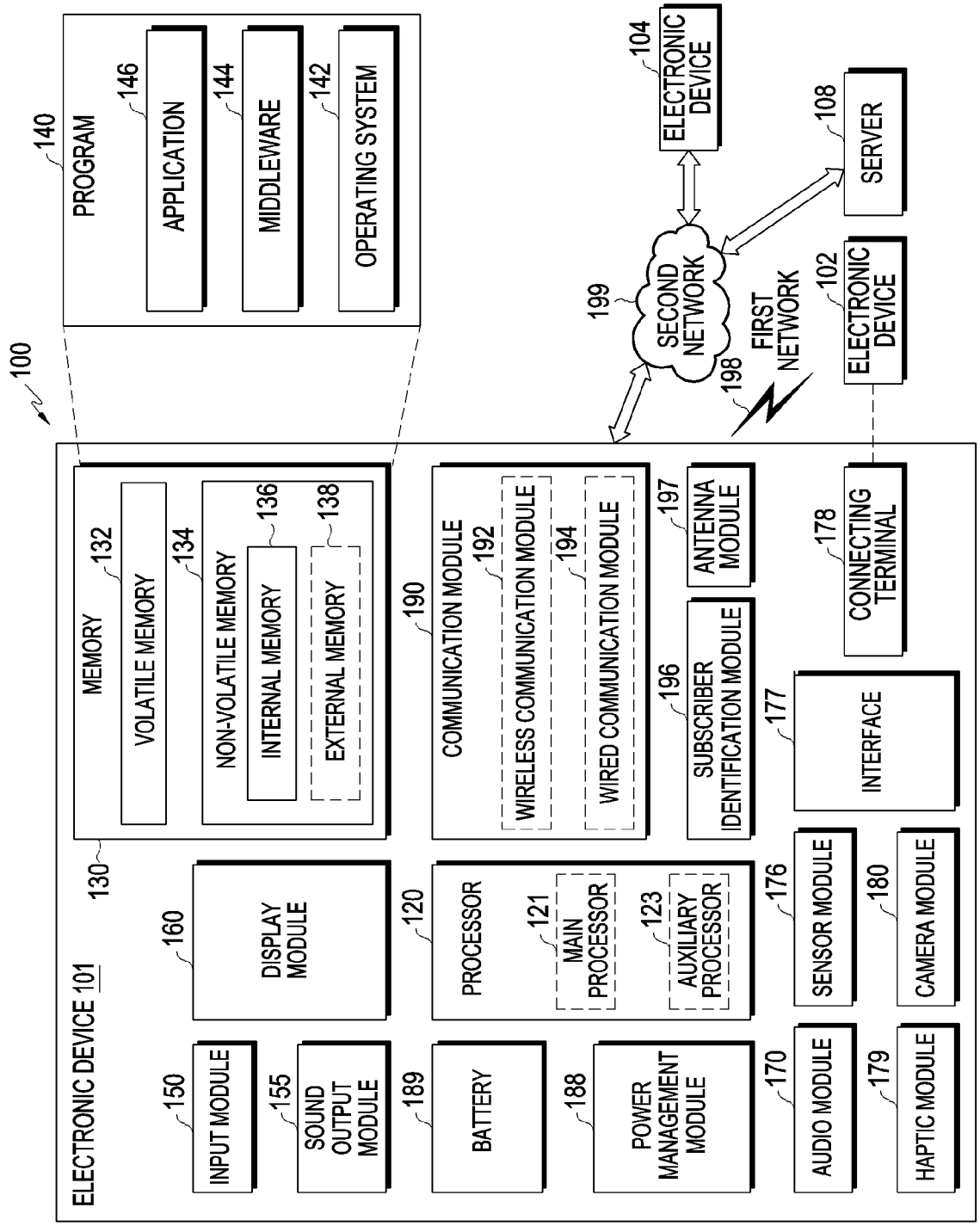
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment of the disclosure, as at least portion of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to an embodiment of the disclosure, the power management module 188 may be implemented as at least portion of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least portion of the function or the service. The one or more external electronic devices receiving the request may perform the at least portion of the function or the service requested, or an additional function or an additional service related to the request, and transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term 'non-transitory' simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
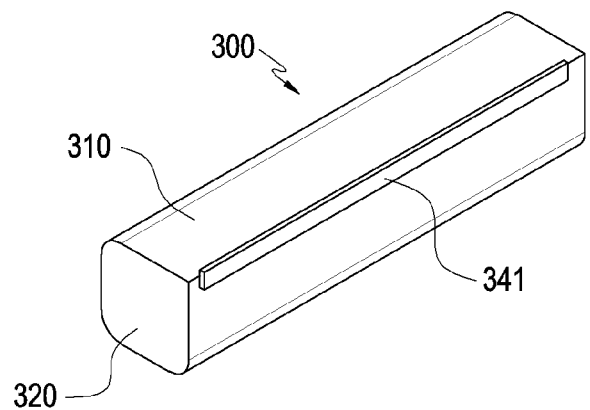
FIG. 2 is a perspective view illustrating an electronic device in a closed state according to an embodiment of the disclosure.
Figure 3:
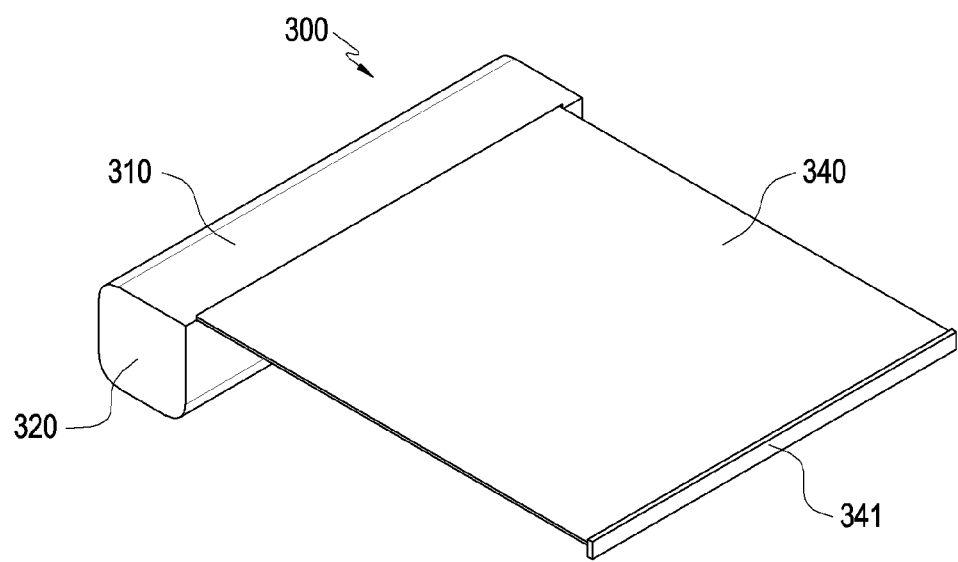
FIG. 3 is a perspective view illustrating an electronic device in an open state according to an embodiment of the disclosure.

FIG. 2 is a perspective view illustrating an electronic device in a closed state according to an embodiment of the disclosure. FIG. 3 is a perspective view illustrating an electronic device in an open state according to an embodiment of the disclosure.

Referring to FIGS. 2 and 3, according to various embodiments of the disclosure, an electronic device 300 (e.g., the electronic device 101 of FIG. 1) may include a cover 310, a bracket 320, a flexible display 340 (e.g., the display module 160 of FIG. 1), and a handle 341.

According to various embodiments of the disclosure, a surface on which a screen of the flexible display 340 is output is defined as a front surface of the electronic device 300. An opposite surface of the front surface is defined as a rear surface of the electronic device 300. Further, a surface surrounding a space between the front and rear surfaces is defined as a side surface of the electronic device 300.

According to various embodiments of the disclosure, the handle 341 connected to the flexible display 340 may be disposed on the side surface of the electronic device 300.

According to various embodiments of the disclosure, the flexible display 340 and the handle 341 may slide with respect to the cover 310. States of the electronic device 300 that vary according to the sliding movement are defined as follows.

In a state of the electronic device 300 according to various embodiments illustrated in FIG. 2, the flexible display 340 is accommodated in the cover 310, and this state may be defined as a 'first position', a 'closed state', or an 'accommodated state'. In a state of the electronic device 300 according to various embodiments illustrated in FIG. 3, the flexible display 340 and the handle 341 slide with respect to the cover 310 so that a screen display area of the flexible display 340 is at least partially or substantially exposed to an external space, and this state may be defined as a 'second position', an 'open state' or an 'extended state'.

The flexible display 340 may be deformed into the shape of a curved surface during switching of the electronic device 300 according to various embodiments from the open state to the closed state. The flexible display 340 may be deformed into the shape of a flat plate during switching of the electronic device 300 according to various embodiments from the closed state to the open state. As the flexible display 340 and the handle 341 move relative to the cover 310, the flexible display 340 may be accommodated into or extended from the cover 310. Depending on relative positions of the flexible display 340 and the cover 310, the flexible display 340 may be at least partially shaped into a curved surface or a flat plate. When it is said that the flexible display 340 is shaped into a flat plate, this may be interpreted as including a state in which the flexible display 340 is shaped into a curved surface with a specific curvature or less. The flexible display 340 may be at least partially shaped into a curved surface inside the cover 310. For example, the flexible display 340 may be rolled to the shape of a cylinder inside the cover 310.

The electronic device 300 according to various embodiments is not limited to the shapes and coupling illustrated in FIGS. 2 and 3, and may be implemented in other shapes or by other combinations and/or couplings of components.

According to various embodiments of the disclosure, while not shown, various key input devices, sound holes, camera opening areas, and/or connector holes may be disposed outside the cover 310 and the bracket 320. The various key input devices, sound holes, camera opening areas, and/or connector holes may be arranged appropriately in number and position based on the appearance of the electronic device 300.

According to various embodiments of the disclosure, the cover 310 and the bracket 320 may be formed of a metal material (e.g., an alloy including aluminum or magnesium) and/or a non-metal material (e.g., glass, a polymer, or ceramic). The material of the cover 310 and the bracket 320 may be selected appropriately based on factors, such as a rigidity required to protect the exterior of the electronic device 300 and internal electric components (e.g., components, such as the communication module, memory, display module, camera module, or connecting terminal of FIG. 1) or ease of molding or processing. In a certain embodiment of the disclosure, part of the cover 310 and the bracket 320 may be made of transparent glass or polymer, and the transparent part may visually expose part of the flexible display 340 accommodated inside the cover 310. For example, even in the state where the flexible display 340 is accommodated in the cover 310, the electronic device 300 may provide visual information through the flexible display 340.

According to various embodiments of the disclosure, the flexible display 340 may include, for example, a display panel made of an organic light emitting diode (OLED), and include a touch screen function to serve as at once an output device (e.g., the display module 160 of FIG. 1) and an input device (e.g., the input module 150 of FIG. 1).

FIG. 3 is a perspective view illustrating an electronic device in an open state according to various embodiments of the disclosure.

According to various embodiments of the disclosure, the flexible display 340 may be disposed inside the cover 310.

According to various embodiments of the disclosure, at least portion of the flexible display 340 may be accommodated in the electronic device 300. The flexible display 340 may be accommodated inside the cover 310 in the closed state of the electronic device 300 and exposed to the outside in the open state of the electronic device 300.

According to various embodiments of the disclosure, while not shown, the electronic device 300 may include components required to drive the electronic device 300. For example, the electronic device 300 may further include an antenna, a PCB, a flexible printed circuit board (FPCB), and so on.

Figure 4:
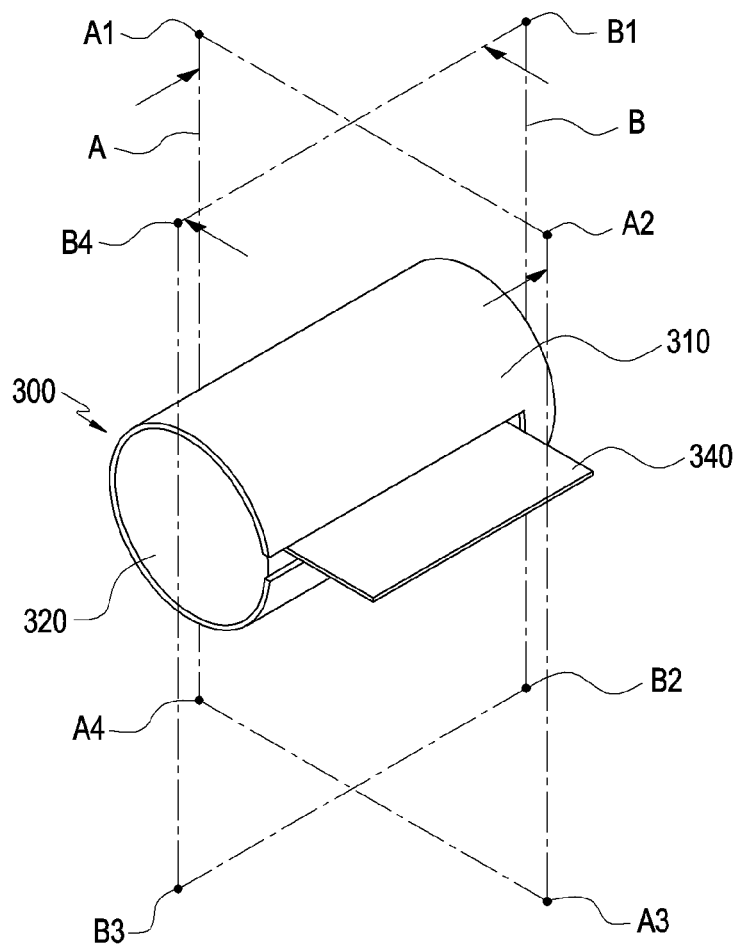
FIG. 4 is a perspective view illustrating an electronic device according to an embodiment of the disclosure.
Figure 5:
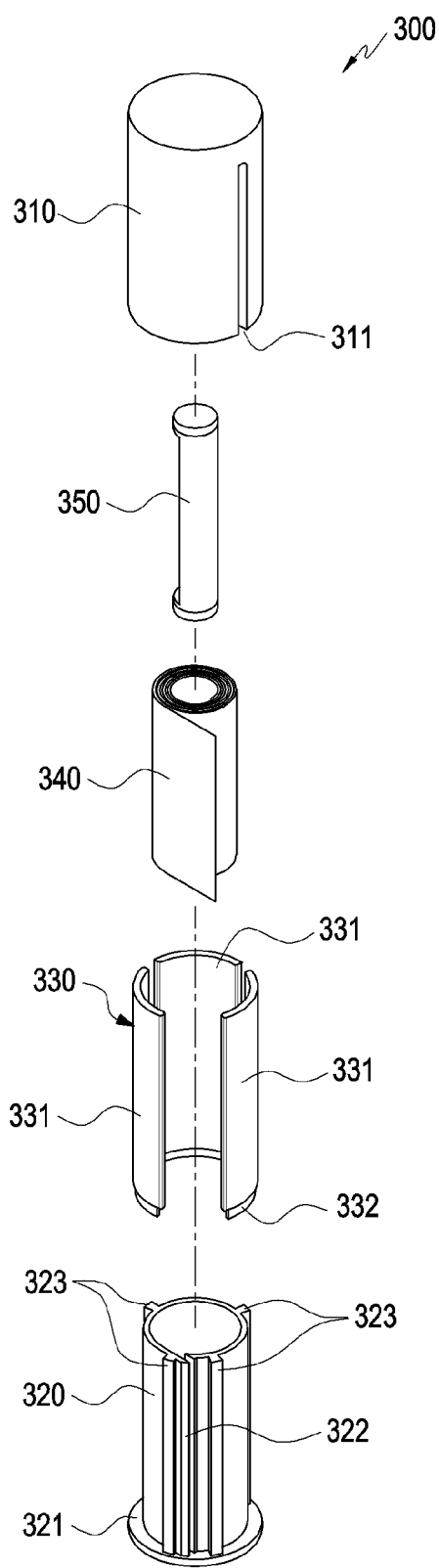
FIG. 5 is an exploded perspective view illustrating an electronic device according to an embodiment of the disclosure.

In relation to a description of FIGS. 4, 5, 6A, 6B, 7A, 7B, 8, 9A, 9B, 10A, and 10B, the following definitions are given. Referring to FIG. 5, a part in which the cover 310 is located is defined as a top, and a direction from the flexible display 340 to the cover 310 along an axis indicated by a dashed-dotted line is defined as an upward direction. Further, a part in which the bracket 320 is located is defined as a bottom, and a direction from the flexible display 340 to the bracket 320 along the axis indicated by the dashed-dotted line is defined as a downward direction.

FIG. 4 is a perspective view illustrating an electronic device according to an embodiment of the disclosure. FIG. 5 is an exploded perspective view illustrating an electronic device according to an embodiment of the disclosure.

Referring to FIGS. 4 and 5, according to various embodiments of the disclosure, the electronic device 300 may have a cylindrical shape. The electronic device 300 may include the cover 310, the bracket 320, a battery 330, the flexible display 340, and a roller 350.

According to various embodiments of the disclosure, the cover 310 may be cylindrical in shape, and a cross-section perpendicular to a longitudinal axis of the cover 310 may be a circle. The bottom of the cover 310 may be open so that the bracket 320, the battery 330, the flexible display 340, and the roller 350 may be accommodated inside the cover 310. The shape of the open part of the cover 310 may correspond to that of a head 321 of the bracket 320. According to various embodiments of the disclosure, the cover 310 may include a cover opening 311 formed on a side surface thereof along the longitudinal direction thereof. The flexible display 340 accommodated in the electronic device 300 may move through the cover opening 311. As the flexible display 340 moves, the flexible display 340 may be inserted into or extended from the cover 310.

According to various embodiments of the disclosure, the bracket 320 may be disposed inside the cover 310. The bracket 320 may be cylindrical in shape, and a cross-section perpendicular to a longitudinal axis of the bracket 320 may be a circle. The bracket head 321 may be disposed under the bracket 320. In a state in which the electronic device 300 is assembled, the bracket head 321 may function as a bottom surface of the cover 310. As the top of the bracket 320 is open, the flexible display 340 and the roller 350 may be accommodated inside the bracket 320. The bracket 320 may include a bracket opening 322 formed on a side surface thereof along a longitudinal direction thereof. The flexible display 340 accommodated inside the electronic device 300 may move through the bracket opening 322. As the flexible display 340 moves, the flexible display 340 may be inserted into or extended from the bracket 320. The bracket 320 may include a bracket rib 323 formed on the side surface thereof along the longitudinal direction thereof. The bracket rib 323 may contact an inner surface of the cover 310. The bracket 320 may include at least one bracket rib 323 formed on the side surface thereof. A space may be formed between the bracket 320 and the cover 310 by the bracket rib 323.

According to various embodiments of the disclosure, at least one battery 330 may be disposed on the side surface of the bracket 320. The battery 330 may be disposed between the bracket 320 and the cover 310. The battery 330 may include at least one battery cell 331. A cross-section perpendicular to a longitudinal axis of the battery cell 331 may be an arc corresponding to a curvature of the side surface of the bracket 320. An FPCB 332 may be disposed under the battery 330. The FPCB 332 may be disposed under the battery 330 along the side surface of the bracket 320. The FPCB 332 may electrically connect the at least one battery cell 331 to each other. The FPCB 332 may include a circuit related to the battery 330. For example, the FPCB 332 may include circuits, such as a protection circuit module (PCM) and a battery management system (BMS).

According to various embodiments of the disclosure, the flexible display 340 may be disposed inside the bracket 320. The flexible display 340 may be rolled to the shape of a cylinder. During switching of the electronic device 300 from the closed state to the open state, the cylindrical flexible display 340 may be deformed into the shape of a flat plate. According to another embodiment of the disclosure, during switching of the electronic device 300 from the open state to the closed state, the flat flexible display 340 may be deformed into the shape of a cylinder. The flexible display 340 may move through the bracket opening 322.

According to various embodiments of the disclosure, the roller 350 may be disposed inside the flexible display 340. The roller 350 may be shaped into a cylinder to wind the flexible display 340 therearound. Part of the roller 350 may be fixed to the cover 310 or the bracket 320, and part of the roller 350 may be rotatable.

Figure 6A:
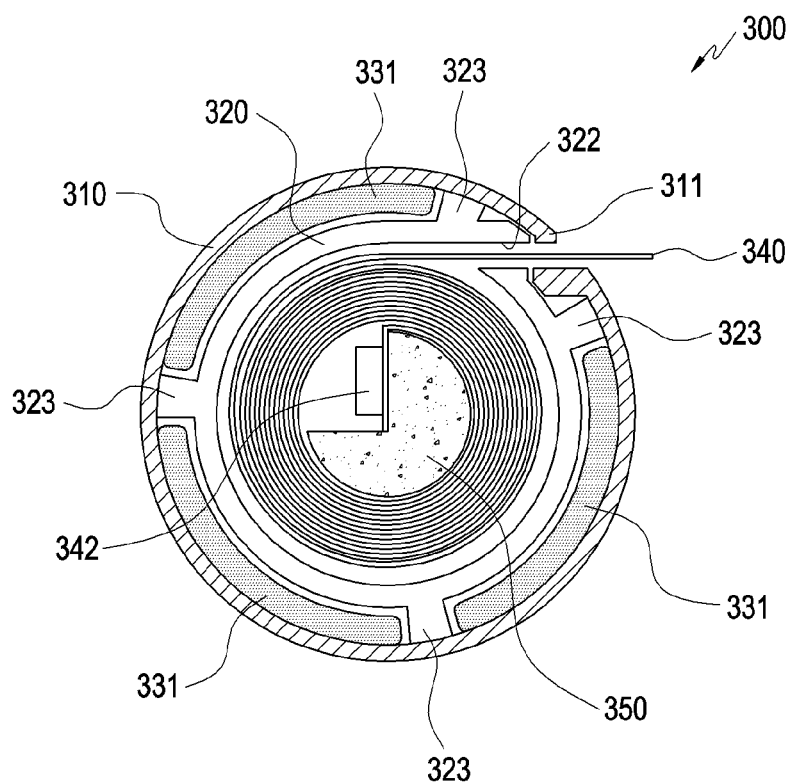
FIGS. 6A and 6B are sectional views illustrating the electronic device of FIG. 4, taken along planes A and B according to various embodiments of the disclosure.
Figure 6B:
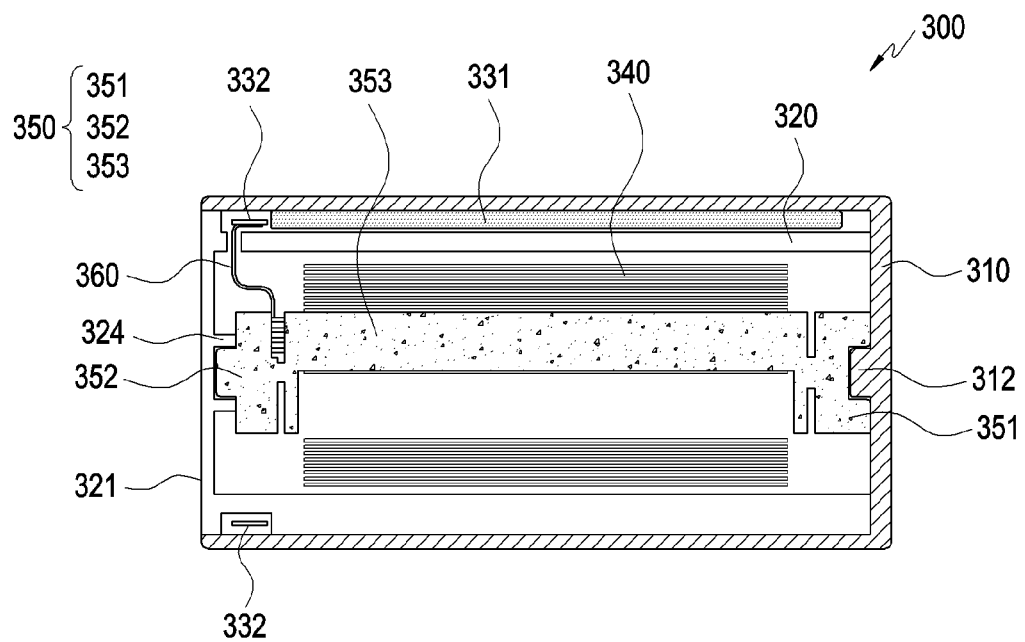

FIGS. 6A and 6B are sectional views illustrating the electronic device of FIG. 4, taken along planes A and B according to various embodiments of the disclosure.

According to various embodiments of the disclosure, the electronic device 300 may include the cover 310, the bracket 320, the battery 330, the flexible display 340, the roller 350, and a connection wire 360. The cover 310, the bracket 320, the battery 330, the flexible display 340, and the roller 350 of FIGS. 6A and 6B may be wholly or partially identical to the cover 310, the bracket 320, the battery 330, the flexible display 340, and the roller 350 of FIGS. 4 and 5. Therefore, a description of the same components may be omitted.

Referring to FIGS. 6A and 6B, the internal structure of the electronic device 300 may be easily understood. The plane A including points A1, A2, A3, and A4 illustrated in FIG. 4 is perpendicular to the longitudinal direction of the electronic device 300. Accordingly, FIG. 6A illustrates a cross-section perpendicular to the longitudinal direction of the electronic device 300 of FIG. 4. Further, the plane B including points B1, B2, B3 and B4 illustrated in FIG. 4 is parallel to the longitudinal direction of the electronic device 300. Accordingly, FIG. 6B illustrates a cross-section parallel to the longitudinal direction of the electronic device 300 of FIG. 4.

According to various embodiments of the disclosure, the cover 310 may include a cover roller fixing member 312 formed inside a top surface of the cover 310. The cover roller fixing member 312 may be coupled with a roller top fixing member 351 of the roller 350. For example, a rectangular column shape insertable into the roller top fixing member 351 may be disposed inside the top surface of the cover 310. In addition, the rectangular column shape may be inserted into the roller top fixing member 351. Therefore, the roller top fixing member 351 may be fixed inside the top surface of the cover 310. The shapes of the roller top fixing member 351 and the structure formed inside the top surface of the cover 310 are not limited to a rectangular column.

According to various embodiments of the disclosure, the bracket opening 322 of the bracket 320 may be disposed to correspond to a position of the cover opening 311 of the cover 310. Accordingly, the flexible display 340 may move inside/outside the bracket 320 and the cover 310. The bracket 320 may include a bracket roller fixing member 324 formed on an inner surface of the bracket head 321. The bracket roller fixing member 324 may be coupled with a roller bottom fixing member 352. For example, the roller bottom fixing member 352 may include a structure formed to protrude in the shape of a rectangular column. In addition, a shape into which the rectangular column-shaped structure formed on a bottom surface of the roller bottom fixing member 352 is fixedly inserted may be disposed on the inner surface of the bracket head 321. Therefore, the roller bottom fixing member 352 may be fixed to the bottom surface of the bracket 320. The shapes of the roller bottom fixing member 352 and the structure formed on the inner surface of the bracket head 321 are not limited to a rectangular column.

According to various embodiments of the disclosure, the battery 330 may be disposed between the cover 310 and the bracket 320. The battery 330 may include the at least one battery cells 331. The bracket 320 may include the at least one bracket rib 323 formed on the side surface thereof. The bracket rib 323 may contact the inner surface of the cover 310. The battery cell 331 may be disposed between a plurality of bracket ribs 323. Accordingly, the battery cell 331 may be fixed, surrounded by the bracket 320, the bracket ribs 323, and the cover 310. As the battery 330 is disposed inside the electronic device 300, the space efficiency of the electronic device 300 may be improved. Accordingly, an increase in the size of the electronic device 300 may be reduced. Further, since the capacity of the battery 330 may be increased by efficiently disposing the battery 330, the use time of the electronic device 300 may be increased. In conclusion, as the battery 330 is disposed inside the electronic device 300, the increase in the size of the electronic device 300 may be reduced, and the capacity of the battery 330 may be increased. The resulting increased use time of the electronic device 300 may increase the user convenience of the electronic device 300.

According to various embodiments of the disclosure, a display driving circuit 342 is disposed at one end of the flexible display 340 connected to the roller 350. The display driving circuit 342 is disposed on the roller 350 and connected to the flexible display 340. The display driving circuit 342 may include a circuit required to drive the flexible display 340. The display driving circuit 342 may be electrically connected to the battery 330 through the connection wire 360. The display driving circuit 342 may be disposed on a roller rotation member 353 of the roller 350.

According to various embodiments of the disclosure, the roller 350 may include the roller top fixing member 351, the roller bottom fixing member 352, and the roller rotation member 353. The roller top fixing member 351 may be fixed to the cover 310 by the cover roller fixing member 312. The roller bottom fixing member 352 may be fixed to the bracket 320 by the bracket roller fixing member 324. The roller rotation member 353 may be disposed between the roller top fixing member 351 and the roller bottom fixing member 352. The roller rotation member 353 may rotate relative to the roller top fixing member 351 and the roller bottom fixing member 352. Accordingly, the roller rotation member 353 may rotate relative to the cover 310 and the bracket 320. Further, one end of the flexible display 340 may be fixed to the roller rotation member 353. Further, the display driving circuit 342 may be disposed on the roller rotation member 353. Accordingly, the flexible display 340 may be wound around the roller 350 by rotation of the roller rotation member 353. A space may be formed in the roller rotation member 353, and the display driving circuit 342 may be disposed in the space. The display driving circuit 342 may be disposed at one end of the flexible display 340 fixed to the roller rotation member 353.

According to various embodiments of the disclosure, the connection wire 360 electrically connects the FPCB 332 connected to the battery 330 to the display driving circuit 342. The display driving circuit 342 receives power or an electrical signal through the connection wire 360.

Figure 7A:
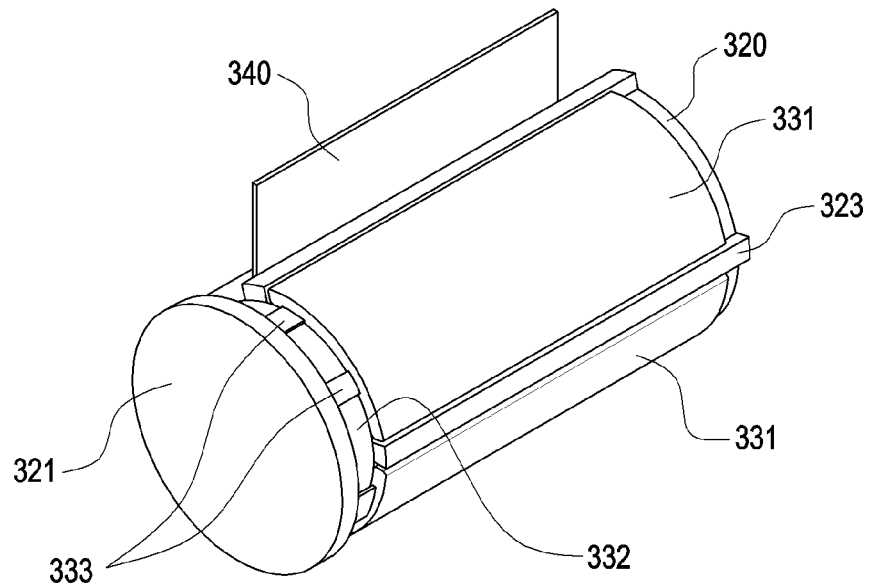
FIG. 7A is a perspective view illustrating an electronic device without a cover according to an embodiment of the disclosure.
Figure 7B:
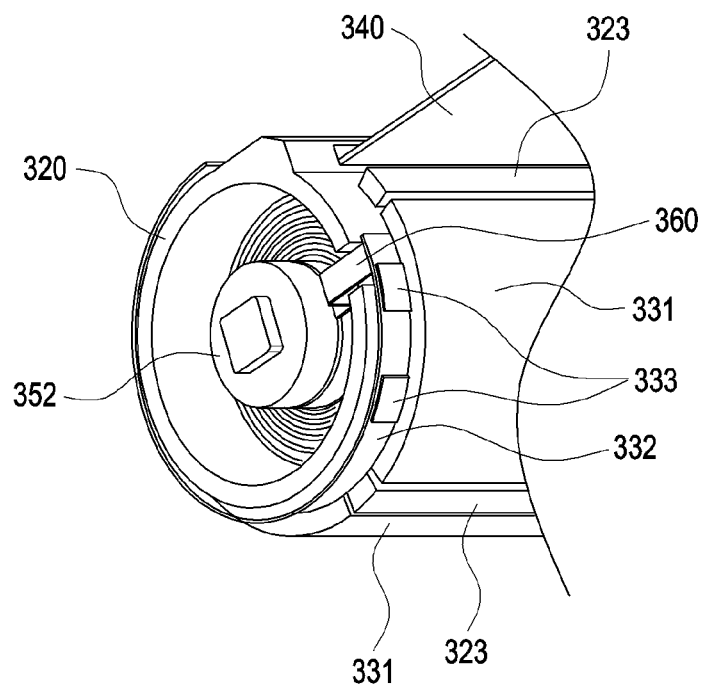
FIG. 7B is a perspective view illustrating the electronic device without the cover and a bracket head according to an embodiment of the disclosure.

FIG. 7A is a perspective view illustrating an electronic device without a cover according to an embodiment of the disclosure. FIG. 7B is a perspective view illustrating the electronic device without the cover and a bracket head according to an embodiment of the disclosure.

According to various embodiments of the disclosure, the electronic device 300 may include the cover 310, the bracket 320, the battery 330, the flexible display 340, the roller 350, and the connection wire 360. The cover 310, the bracket 320, the battery 330, the flexible display 340, the roller 350, and the connection wire 360 of FIGS. 7A and 7B may be wholly or partially identical to the cover 310, the bracket 320, the battery 330, the flexible display 340, the roller 350, and the connection wire 360 of FIGS. 4, 5, 6A, and 6B. Therefore, a description of the same components may be omitted.

According to various embodiments of the disclosure, the battery cell 331 of the battery 330 may be disposed on the side surface of the bracket 320. The battery cell 331 may be disposed between at least one bracket rib 323. The battery 330 may be connected to the FPCB 332. The FPCB 332 may be disposed under the bracket 320. The FPCB 332 may be connected to the at least one battery cell 331 and to the connection wire 360. The battery 330 may include at least one electrode tab 333. The electrode tab 333 may electrically connect the at least one battery cell 331 to the FPCB 332. The at least one battery cell 331 may be connected in series or parallel through the FPCB 332 and the electrode tab 333.

According to various embodiments of the disclosure, the connection wire 360 may connect the FPCB 332 and the display driving circuit 342 to each other. The FPCB 332 may be disposed between the bracket head 321 and the battery cell 331. Further, the FPCB 332 may be disposed between the bracket head 321 and the bracket rib 323. The connection wire 360 will be described later with reference to FIGS. 10A and 10B.

Figure 8:
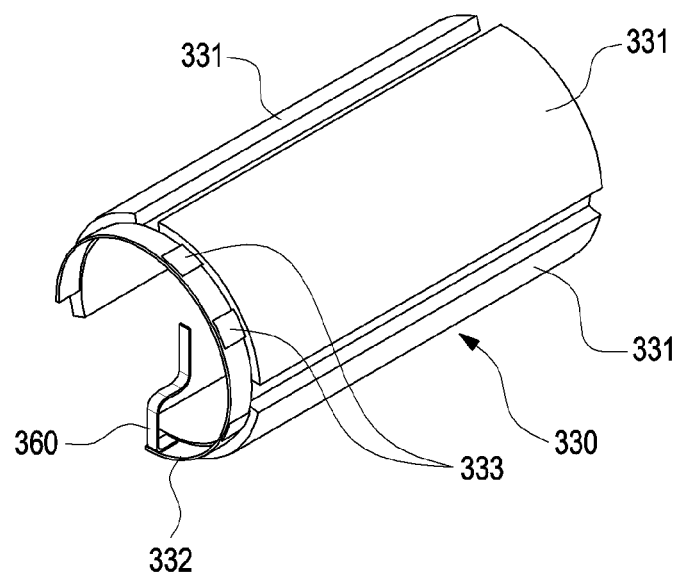
FIG. 8 is a perspective view illustrating a battery and a connection wire according to an embodiment of the disclosure.

FIG. 8 is a perspective view illustrating a battery and a connection wire according to an embodiment of the disclosure.

According to various embodiments of the disclosure, the electronic device 300 may include the cover 310, the bracket 320, the battery 330, the flexible display 340, the roller 350, and the connection wire 360. The cover 310, the bracket 320, the battery 330, the flexible display 340, the roller 350, and the connection wire 360 of FIG. 8 may be wholly or partially identical to the cover 310, the bracket 320, the battery 330, the flexible display 340, the roller 350, and the connection wire 360 of FIGS. 4, 5, 6A, 6B, 7A, and 7B. Therefore, a description of the same components may be omitted.

According to various embodiments of the disclosure, a cross-section with respect to the longitudinal axis of the battery cell 331 may be an arc in shape. The electronic device 300 may include at least one battery cell 331. Each battery cell 331 may have the same curvature. Accordingly, the battery cell 331 may be disposed at the same distance from one axis.

According to various embodiments of the disclosure, the FPCB 332 may be disposed under the battery 330 and electrically connect the at least one battery cell 331 to each other. The FPCB 332 may be connected to the connection wire 360.

According to various embodiments of the disclosure, the connection wire 360 may extend toward the center of a circle formed by the at least one battery cell 331. The connection wire 360 may be connected to the display driving circuit 342 disposed on the roller 350. The display driving circuit 342 will be described later with reference to FIGS. 9A and 9B.

Figure 9A:
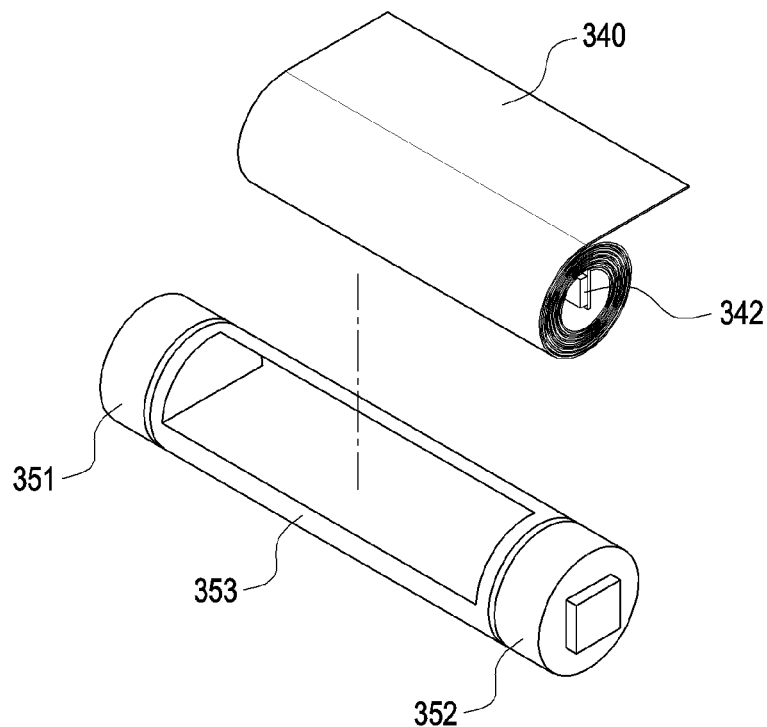
FIGS. 9A and 9B are perspective views illustrating a display and a roller in an electronic device in a closed state and an open state according to various embodiments of the disclosure.
Figure 9B:
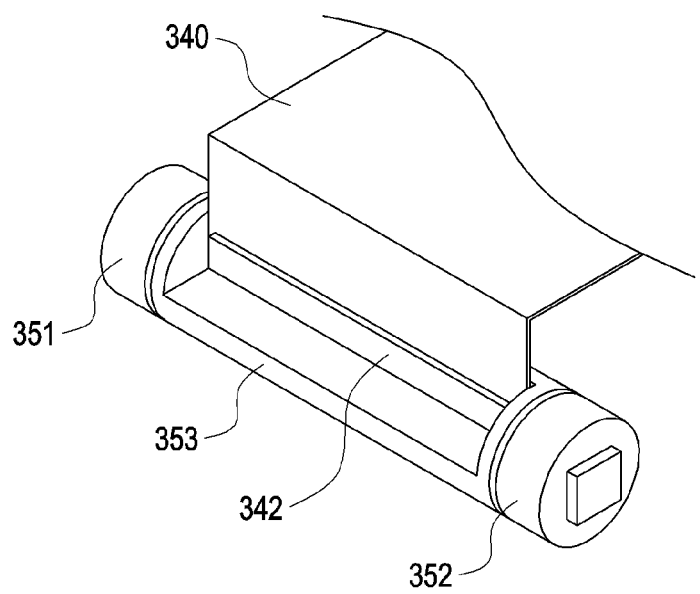

FIGS. 9A and 9B are perspective views illustrating a flexible display and a roller in an electronic device in an open state and a closed state according to various embodiments of the disclosure.

According to various embodiments of the disclosure, the electronic device 300 may include the cover 310, the bracket 320, the battery 330, the flexible display 340, the roller 350, and the connection wire 360. The cover 310, the bracket 320, the battery 330, the flexible display 340, the roller 350, and the connection wire 360 of FIGS. 9A and 9B may be wholly or partially identical to the cover 310, the bracket 320, the battery 330, the flexible display 340, the roller 350, and the connection wire 360 of FIGS. 4, 5, 6A, 6B, 7A, 7B, and 8. Therefore, a description of the same components may be omitted.

Referring to FIGS. 9A and 9B, according to various embodiments of the disclosure, the display driving circuit 342 may be disposed at one end of the flexible display 340 connected to the roller rotation member 353 of the roller 350. The display driving circuit 342 may be connected to a roller circuit 354. The roller circuit 354 may be disposed on the roller rotation member 353. For example, the roller circuit 354 may be disposed on one side of the roller rotation member 353 adjacent to the roller bottom fixing member 352. The roller circuit 354 will be described later with reference to FIGS. 10A and 10B.

Figure 10A:
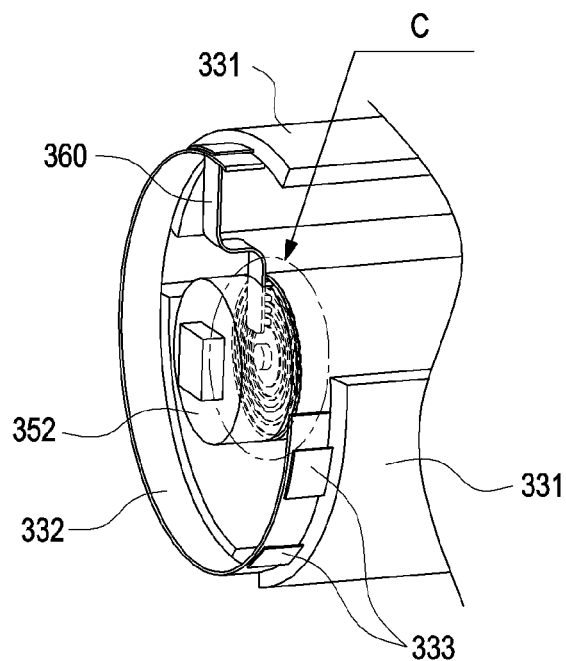
FIG. 10A is a perspective view illustrating a battery and a roller according to an embodiment of the disclosure.
Figure 10B:
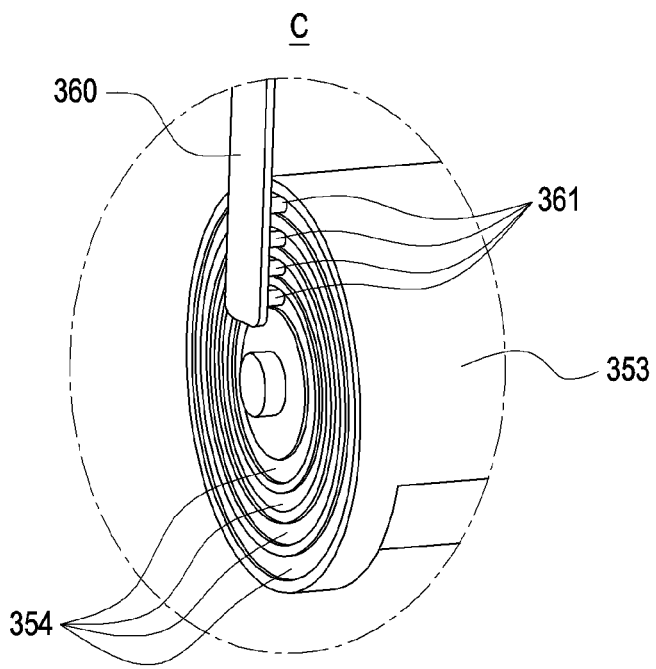
FIG. 10B is an enlarged perspective view illustrating a part C of the roller of FIG. 10A according to an embodiment of the disclosure.

FIG. 10A is a perspective view illustrating a battery and a roller according to an embodiment of the disclosure. FIG. 10B is an enlarged perspective view illustrating a part C of the roller of FIG. 10A according to an embodiment of the disclosure.

According to various embodiments of the disclosure, the electronic device 300 may include the cover 310, the bracket 320, the battery 330, the flexible display 340, the roller 350, and the connection wire 360. The cover 310, the bracket 320, the battery 330, the flexible display 340, the roller 350, and the connection wire 360 of FIGS. 10A and 10B may be wholly or partially identical to the cover 310, the bracket 320, the battery 330, the flexible display 340, the roller 350, and the connection wire 360 of FIGS. 4, 5, 6A, 6B, 7A, 7B, 8, 9A, and 9B. Therefore, a description of the same components may be omitted.

Referring to FIG. 10A, according to various embodiments of the disclosure, the battery 330 may be electrically connected to the FPCB 332, and the FPCB 332 may receive power from the battery 330. The FPCB 332 may be electrically connected to the connection wire 360, and the connection wire 360 may be electrically connected to the roller circuit 354. Accordingly, the roller circuit 354 may receive power and an electrical signal from the FPCB 332 through the connection wire 360. The roller circuit 354 may be electrically connected to the display driving circuit 342 so that the display driving circuit 342 may receive power and an electrical signal from the roller circuit 354. The display driving circuit 342 may be connected to the flexible display 340 to drive the flexible display 340 through the received power and electrical signal. The connection wire 360 will be described later with reference to FIG. 10B.

FIG. 10B is an enlarged view illustrating the part C of FIG. 10A. Referring to FIG. 10B, according to various embodiments of the disclosure, the connection wire 360 may include at least one pogo pin 361. The roller circuit 354 disposed on the rotation member 353 may be connected to the connection wire 360 through the pogo pin 361. The at least one pogo pin 361 may be disposed in a direction perpendicular to one surface of the connection wire 360. The at least one pogo pin 361 may be connected to at least portion of the roller circuit 354. The roller circuit 354 may include at least one circuit in contact with the pogo pin 361. The at least one circuit of the roller circuit 354 may be arranged in a concentric circle with the central axis of the roller rotation member 353 as an origin. In addition, the at least one pogo pin 361 361 may contact the at least one circuit of the roller circuit 354, respectively. Accordingly, even when the roller rotation member 353 rotates, the pogo pin 361 and the roller circuit 354 may be kept in contact.

As such, the display driving circuit 342 may stably receive power and an electrical signal by using the pogo pin 361, even if the roller rotation member 353 rotates. In addition, the use of the pogo pin 361 may increase the durability and space utilization of the electronic device 300.

Figure 11:
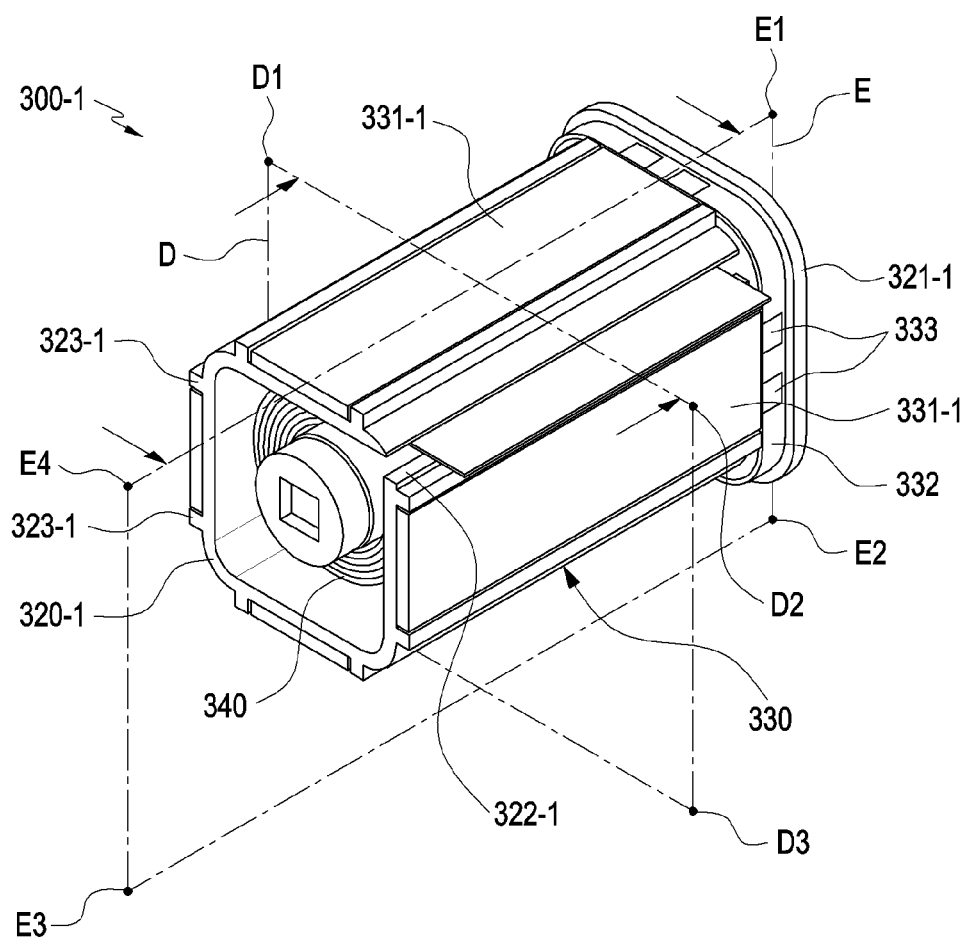
FIG. 11 is a perspective view illustrating an electronic device without a cover according to an embodiment of the disclosure.

FIG. 11 is a perspective view illustrating an electronic device without a cover according to an embodiment of the disclosure.

According to various embodiments of the disclosure, an electronic device 300-1 may include a cover (e.g., a cover 310-1 of FIGS. 12A and 12B), a bracket 320-1, the battery 330, the flexible display 340, the roller 350, and the connection wire 360. The cover (the cover 310-1 of FIGS. 12A and 12B), the bracket 320-1, the battery 330, the flexible display 340, the roller 350, and the connection wire 360 of FIG. 11 may be wholly or partially identical to the cover 310, the bracket 320, the battery 330, the flexible display 340, the roller 350, and the connection wire 360 of FIGS. 4, 5, 6A, 6B, 7A, 7B, 8, 9A, 9B, 10A, and 10B. Therefore, a description of the same components may be omitted. In FIG. 11, the cover 310-1 is not shown to describe the internal structure of the cover (the cover 310-1 of FIGS. 12A and 12B) in detail.

According to various embodiments of the disclosure, the electronic device 300-1 may be a rectangular column in shape. A cross-section perpendicular to a longitudinal axis of the electronic device 300-1 may be a rectangular. The bottom of the cover 310-1 may be open to accommodate the bracket 320-1, the battery 330, the flexible display 340, the roller 350, and the connection wire 360 therein. The shape of the open part of the cover 310-1 may correspond to that of a head 321-1 of the bracket 320-1. According to various embodiments of the disclosure, the cover 310-1 may include a cover opening 311-1 formed on a side surface thereof along a longitudinal direction thereof. The flexible display 340 accommodated inside the electronic device 300-1 may move through the cover opening 311-1. As the flexible display 340 moves, the flexible display 340 may be inserted into or extended from the cover 310-1.

According to various embodiments of the disclosure, the bracket 320-1 may be disposed inside the cover 310-1. The bracket 320-1 may be a rectangular column in shape, and a cross-section perpendicular to a longitudinal axis of the bracket 320-1 may be a rectangular. The bracket head 321-1 may be disposed under the bracket 320-1. In a state where the electronic device 300-1 is assembled, the bracket head 321-1 may function as a bottom surface of the cover 310-1. The top of the bracket 320-1 is open, so that the flexible display 340 and the roller 350 may be accommodated inside the bracket 320-1. The bracket 320-1 may include a bracket opening 322-1 formed on a side surface thereof along a longitudinal direction thereof. The flexible display 340 accommodated inside the electronic device 300-1 may move through the bracket opening 322-1. As the flexible display 340 moves, the flexible display 340 may be inserted into or extended from the bracket 320-1.

The bracket 320-1 may include a bracket rib 323-1 formed on the side surface thereof along the longitudinal direction thereof. For example, the bracket 320-1 may include two bracket ribs 323-1 formed on each side surface thereof. The bracket rib 323-1 may contact an inner surface of the cover 310-1. Accordingly, a space may be formed between the bracket 320-1 and the cover 310-1.

According to various embodiments of the disclosure, the battery 330 may be disposed on a side surface of the bracket 320-1. The battery 330 may be disposed in the space formed between the bracket 320-1 and the cover 310-1. For example, one battery cell 331-1 may be disposed on each side surface of the bracket 320-1. A cross-section perpendicular to the longitudinal axis of the battery cell 331-1 may be a rectangular. The FPCB 332 may be disposed under the battery 330. The FPCB 332 may be disposed under the battery 330 along the side surfaces of the bracket 320-1. The FPCB 332 may electrically connect the at least one battery cell 331-1 to each other.

Figure 12A:
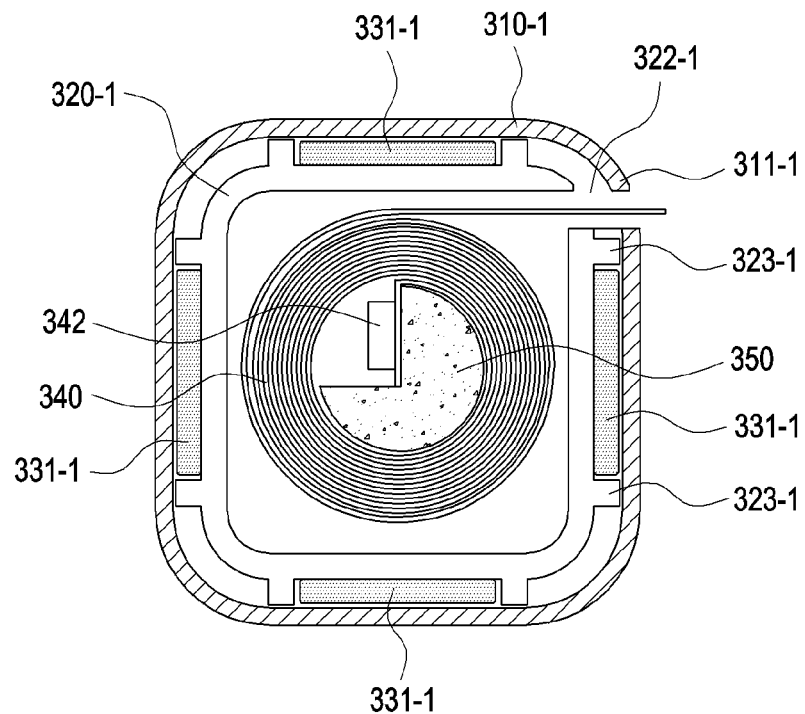
FIGS. 12A and 12B are sectional views illustrating the electronic device of FIG. 11, taken along planes C and D according to various embodiments of the disclosure.
Figure 12B:
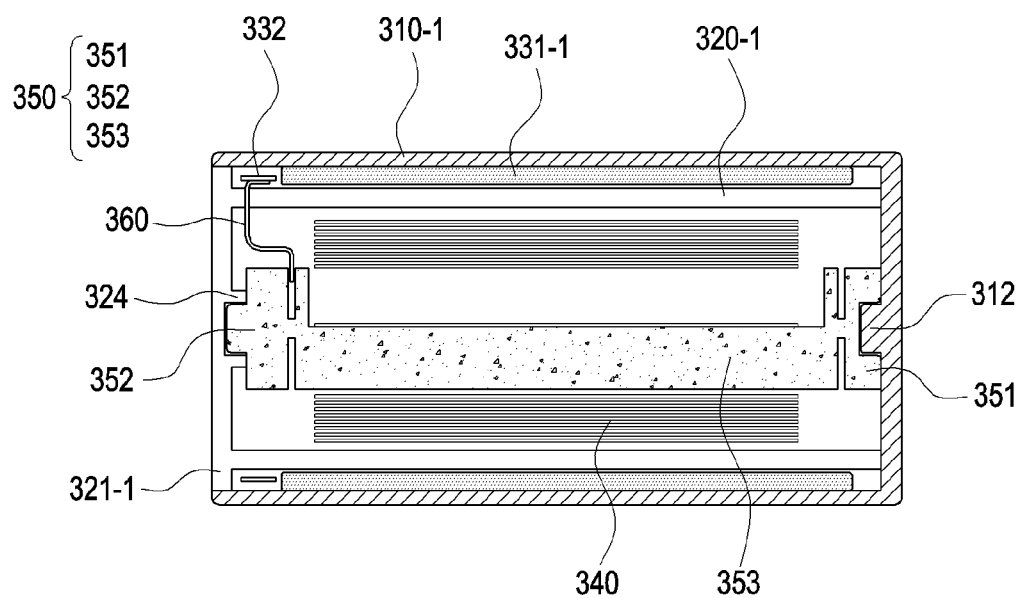

FIGS. 12A and 12B are sectional views illustrating the electronic device of FIG. 11, taken along planes D and E according to various embodiments of the disclosure. FIGS. 12A and 12B illustrate cross-sections including the cover 310-1.

According to various embodiments of the disclosure, the electronic device 300-1 may include the cover 310-1, the bracket 320-1, the battery 330, the flexible display 340, the roller 350, and the connection wire 360. The cover 310-1, the bracket 320-1, the battery 330, the flexible display 340, the roller 350, and the connection wire 360 of FIGS. 12A and 12B may be wholly or partially identical to the battery 330, the flexible display 340, the roller 350, and the connection wire 360 of FIGS. 6A and 6B, and wholly or partially identical to the cover 310-1, the bracket 320-1, the battery 330, the flexible display 340, the roller 350, and the connection wire 360 of FIG. 11. Therefore, a description of the same components may be omitted.

Referring to FIGS. 12A and 12B, the internal structure of the electronic device 300-1 may be easily understood. The plane D including points D1, D2, D3, and D4 (not shown) is perpendicular to a longitudinal direction of the electronic device 300-1. Accordingly, FIG. 12A illustrates a cross-section perpendicular to the longitudinal direction of the electronic device 300-1 of FIG. 11. In addition, the plane E including points E1, E2, E3, and E4 is parallel to the longitudinal direction of the electronic device 300-1. Accordingly, FIG. 12B illustrates a cross-section parallel to the longitudinal direction of the electronic device 300-1 of FIG. 11.

According to various embodiments of the disclosure, a cross-section perpendicular to a longitudinal axis of the cover 310-1 may be a rectangular. The cover opening 311-1 may be disposed on a side surface of the cover 310-1. The flexible display 340 may move inside/outside the cover 310-1 through the cover opening 311-1.

According to various embodiments of the disclosure, the bracket opening 322-1 disposed on a side surface of the bracket 320-1 may be disposed at a position corresponding to the cover opening 311-1 formed on the side surface of the cover 310-1. Accordingly, the flexible display 340 may move inside/outside the bracket 320-1 and the cover 310-1. The bracket rib 323-1 may be disposed on a side surface of the bracket 320-1. The bracket rib 323-1 may contact the inner surface of the cover 310-1. Two bracket ribs 323-1 may be disposed on each side surface of the bracket 320-1. A battery cell 331-1 may be disposed between the two bracket ribs 323-1 disposed on each side surface of the bracket 320-1. Accordingly, four battery cells 331-1 may be disposed on the respective rectangular side surfaces of the bracket 320-1.

Figure 13:
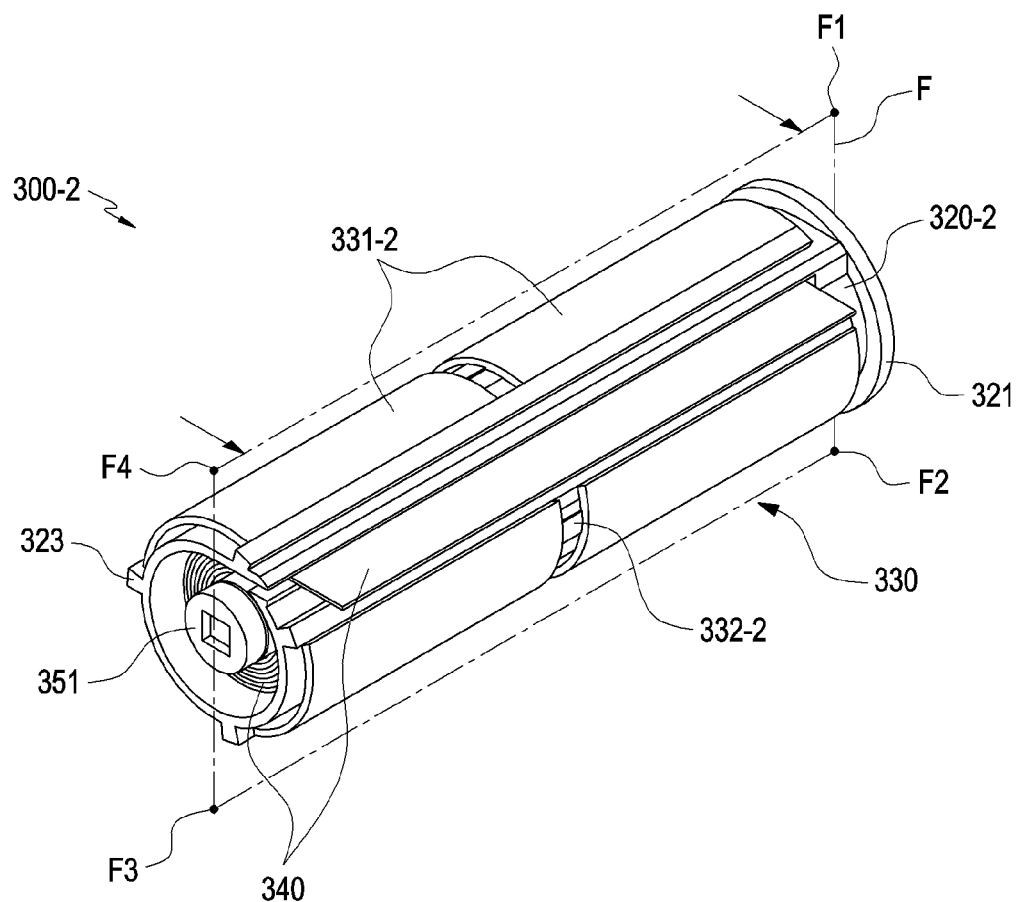
FIG. 13 is a perspective view illustrating an electronic device without a cover according to an embodiment of the disclosure.
Figure 14:
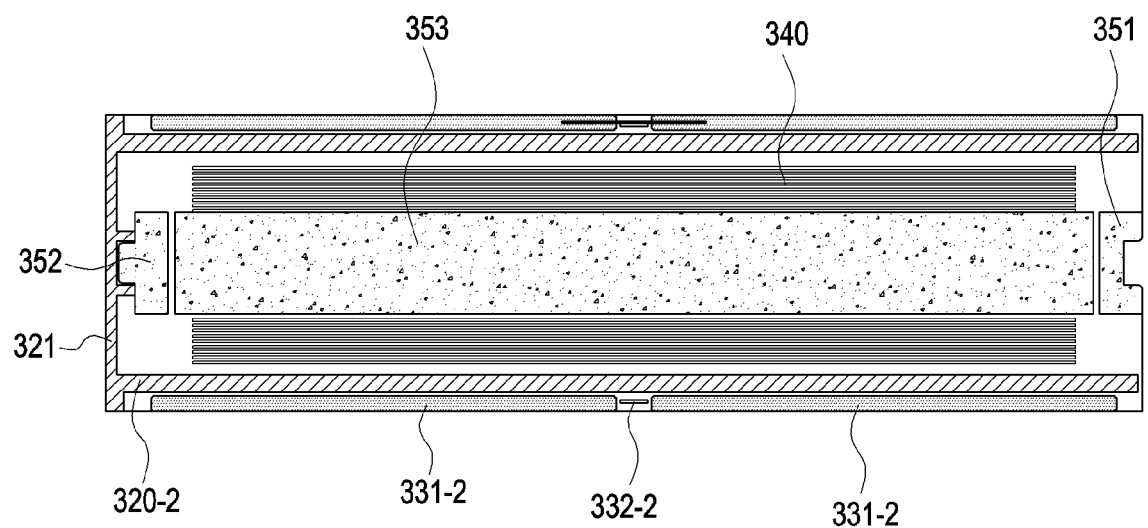
FIG. 14 is a sectional view illustrating the electronic device of FIG. 13, taken along a plane F according to an embodiment of the disclosure.

FIG. 13 is a perspective view illustrating an electronic device without a cover according to an embodiment of the disclosure. FIG. 14 is a sectional view illustrating the electronic device of FIG. 13, taken along a plane F according to an embodiment of the disclosure.

According to various embodiments of the disclosure, an electronic device 300-2 may include a cover (not shown), a bracket 320-2, the battery 330, the flexible display 340, the roller 350, and the connection wire 360. The cover (not shown), the bracket 320-2, the battery 330, the flexible display 340, the roller 350, and the connection wire 360 of FIGS. 13 and 14 may be wholly or partially identical to the cover 310, the bracket 320, the battery 330, the flexible display 340, the roller 350, and the connection wire 360 of FIGS. 4, 5, 6A, 6B, 7A, 7B, 8, 9A, 9B, 10A, and 10B. Therefore, a description of the same components may be omitted.

According to various embodiments of the disclosure, the shape of the cover (not shown) of the electronic device 300-2 may be the same as or similar to that of the cover 310 of FIG. 4. Accordingly, a description of the cover (not shown) of the electronic device 300-2 is omitted.

Referring to FIG. 14, the internal structure of the electronic device 300-2 may be easily understood. The plane F including points F1, F2, F3, and F4 is parallel to a longitudinal direction of the electronic device 300-2. Accordingly, FIG. 14 illustrates a cross-section parallel to the longitudinal direction of the electronic device 300-2 of FIG. 13.

According to various embodiments of the disclosure, the electronic device 300-2 of FIG. 14 may be longer than the electronic device 300 of FIG. 4. Accordingly, the electronic device 300-2 may include a larger flexible display 340. As the electronic device 300-2 is longer, the size of a space in which the battery 330 may be disposed may increase.

According to various embodiments of the disclosure, the battery 330 may be included between the cover (not shown) and the bracket 320-2. The battery 330 may include at least one battery cell 331-2. The at least one battery cell 331-2 may be disposed in a longitudinal direction of the bracket 320-2. For example, two battery cells 331-2 may be disposed in the longitudinal direction. Accordingly, as the size of the flexible display 340 increases, a battery cell 331-2 may be additionally disposed, thereby increasing the capacity of the battery 330. The increased capacity of the battery 330 may lead to an increased use time of the electronic device 300-2 and improved user convenience.

According to various embodiments of the disclosure, as illustrated in FIG. 6B, an FPCB (332 in FIG. 5) may be disposed in the electronic device 300-2, and an FPCB 332-2 may be disposed between battery cells 331-2. The FPCB 332-2 may electrically connect the plurality of battery cells 331-2 to each other. The battery 330 may include at least one electrode tab (333 in FIG. 7A). The electrode tab 333 may electrically connect the battery cells 331-2 to the FPCB 332. The battery cells 331-2 may be connected in series or parallel through the electrode tab 333 and the FPCB 332 or 332-2. The FPCB 332-2 may include a circuit related to the battery 330, like the FPCB (332 in FIG. 5). For example, the FPCB 332-2 may include circuits, such as a PCM and a BMS.

Figure 15A:
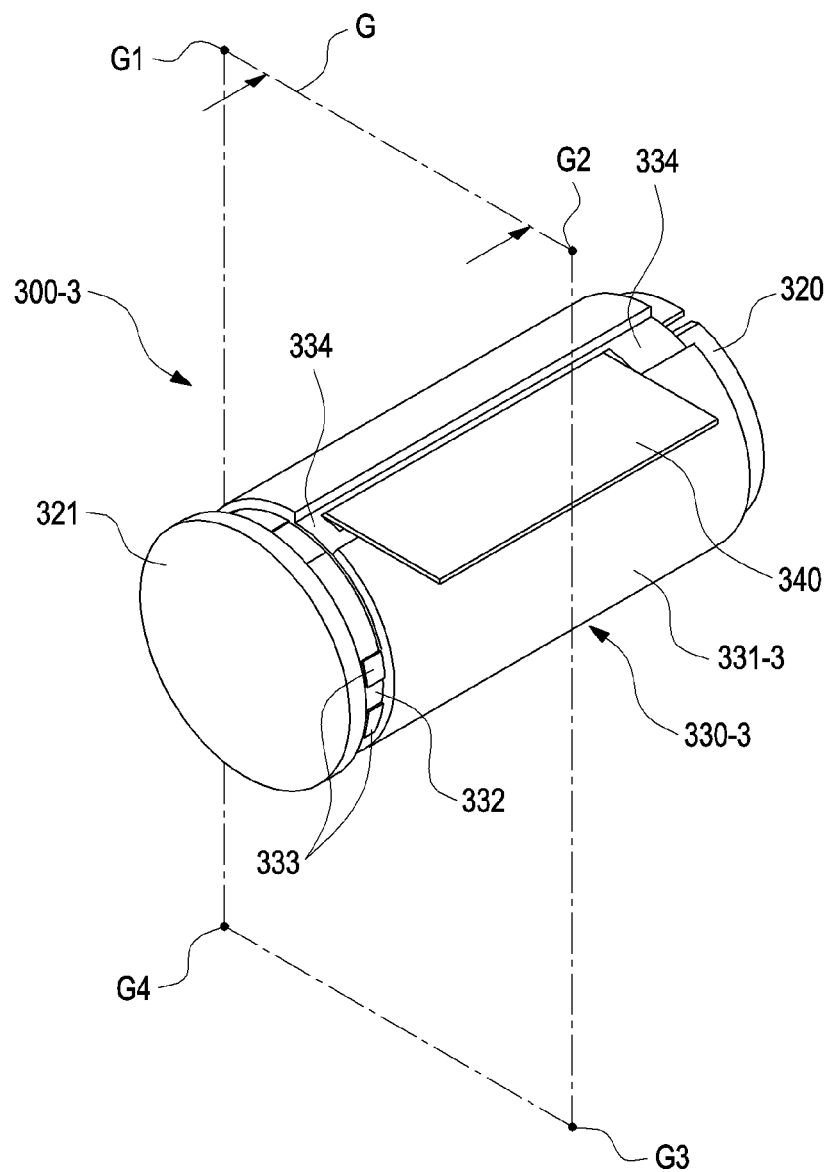
FIG. 15A is a perspective view illustrating an electronic device without a cover according to an embodiment of the disclosure.
Figure 15B:
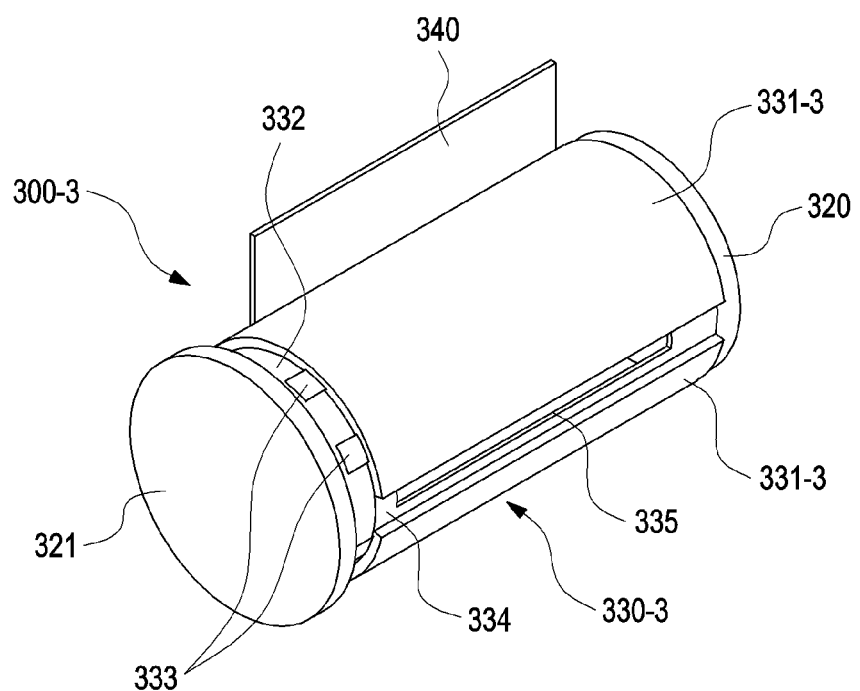
FIG. 15B is a perspective view illustrating the electronic device from a different angle from that of FIG. 15A according to an embodiment of the disclosure.
Figure 16:
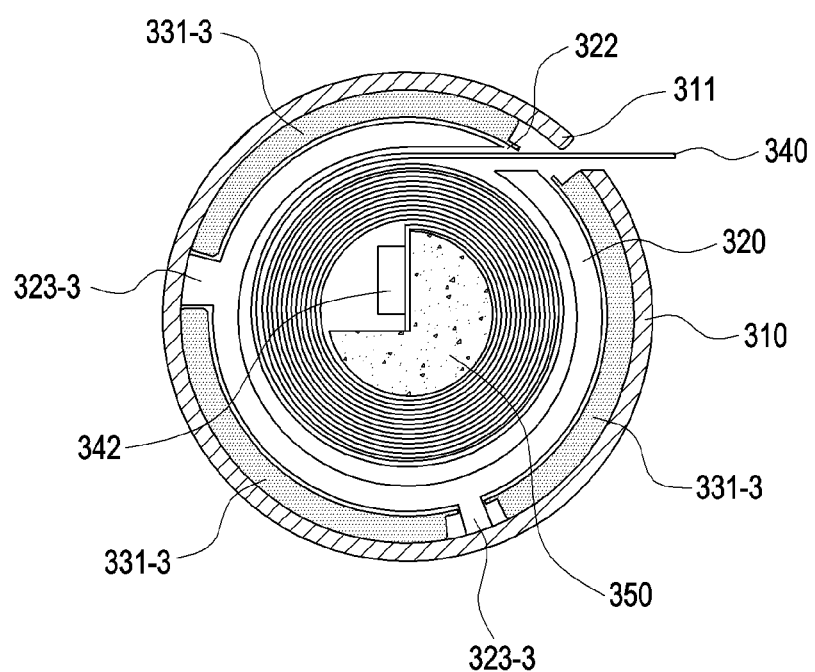
FIG. 16 is a sectional view illustrating the electronic device of FIG. 15A, taken along a plane F according to an embodiment of the disclosure.
Figure 17A:
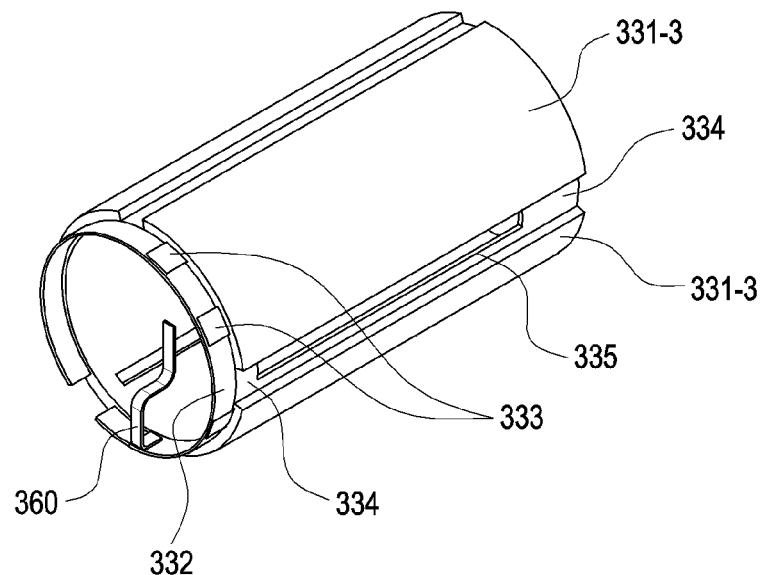
FIG. 17A is a perspective view illustrating a battery according to an embodiment of the disclosure.
Figure 17B:
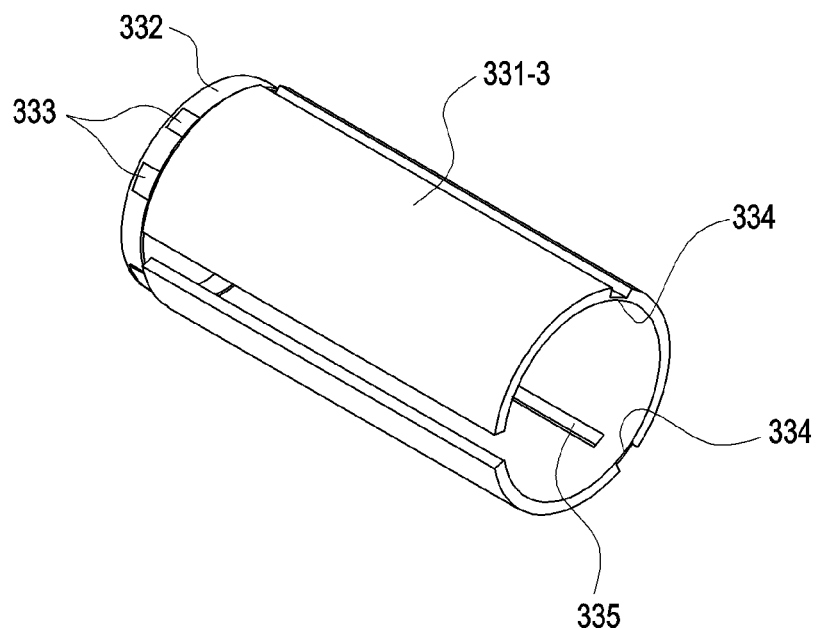
FIG. 17B is a perspective view illustrating the battery from a different angle from that of FIG. 17A according to an embodiment of the disclosure.

FIG. 15A is a perspective view illustrating an electronic device without a cover according to an embodiment of the disclosure. FIG. 15B is a perspective view illustrating the electronic device from a different angle from that of FIG. 15A according to an embodiment of the disclosure. FIG. 16 is a sectional view illustrating the electronic device of FIG. 15A, taken along a plane G according to an embodiment of the disclosure. FIG. 17A is a perspective view illustrating a battery according to an embodiment of the disclosure. FIG. 17B is a perspective view illustrating the battery from a different angle from that of FIG. 17A according to an embodiment of the disclosure.

Referring to FIG. 16, the internal structure of an electronic device 300-3 may be easily grasped. The plane G including points G1, G2, G3 and G4 is perpendicular to a longitudinal direction of the electronic device 300-3. Accordingly, FIG. 16 illustrates a cross-section perpendicular to the longitudinal direction of the electronic device 300-3 of FIG. 15A.

The electronic device 300-3 will be described below with reference to FIGS. 15A, 15B, 16, 17A, and 17B. According to various embodiments of the disclosure, the electronic device 300-3 may include a cover (310 in FIG. 16), the bracket 320, a pouch-shaped battery 330-3, the flexible display 340, the roller 350, and the connection wire 360. The cover (310 in FIG. 16), the bracket 320, the pouch-shaped battery 330-3, the flexible display 340, the roller 350, and the connection wire 360 of FIGS. 15A, 15B, 16, 17A, 17B, and 18 may be wholly or partially identical to the cover 310, the bracket 320, the battery 330, the flexible display 340, the roller 350, and the connection wire 360 of FIGS. 4, 5, 6A, 6B, 7A, 7B, 8, 9A, 9B, 10A, and 10B. Therefore, a description of the same components may be omitted. According to various embodiments of the disclosure, the shape of the cover (310 of FIG. 16) of the electronic device 300-3 may be the same as or similar to that of the cover 310 of FIG. 4. Accordingly, a description of the cover of the electronic device 300-2 is omitted.

According to various embodiments of the disclosure, the pouch-shaped battery 330-3 of the electronic device 300-3 may include at least one battery cell 331-3. The at least one battery cell 331-3 may be connected through a battery connection member 334. The pouch-shaped battery 330-3 of the electronic device 300-3 may be shaped into a pouch. Since the pouch-shaped battery 330-3 is deformable, it may be flexibly disposed even when the design of the electronic device 300-3 is deformed. Accordingly, the design freedom of the electronic device 300-3 may be high. In addition, since the pouch-shaped battery 330-3 has high space efficiency and is lightweight, user convenience may be improved.

According to various embodiments of the disclosure, the electronic device 300-3 may include the pouch-shaped battery 330-3. The pouch-shaped battery 330-3 may include the at least one battery cell 331-3. For example, the pouch-shaped battery 330-3 may include three battery cells 331-3 as illustrated in FIG. 16. The battery 330-3 may include at least one electrode tab 333. The electrode tab 333 may electrically connect the battery cell 331-3 and the FPCB 332 to each other. The at least one battery cell 331 may be connected in series or parallel through the FPCB 332 and the electrode tab 333. The battery connection member 334 may be disposed between battery cells 331-3 of the pouch-shaped battery 330-3 to electrically connect the at least one battery cell 331-3 to each other. The pouch-shaped battery 330-3 may include a battery pocket opening 335 formed between the battery connection member 334 and the battery cell 331-3. A bracket rib 323-3 may penetrate through the battery pocket opening 335. As the bracket rib 323-3 penetrates through the battery pocket opening 335, the pouch-shaped battery 330-3 may be fixed to the bracket 320.

According to various embodiments of the disclosure, the flexible display 340 may move through the battery pocket opening 335. According to another embodiment of the disclosure, the flexible display 340 may pass between two non-adjacent battery cells 331-3 in a flat state, not through the battery pocket opening 335. In other words, when two non-adjacent battery cells 331-3 are disposed on the bracket 320 to be adjacent to each other, the flexible display 340 may pass between them.

Figure 18:
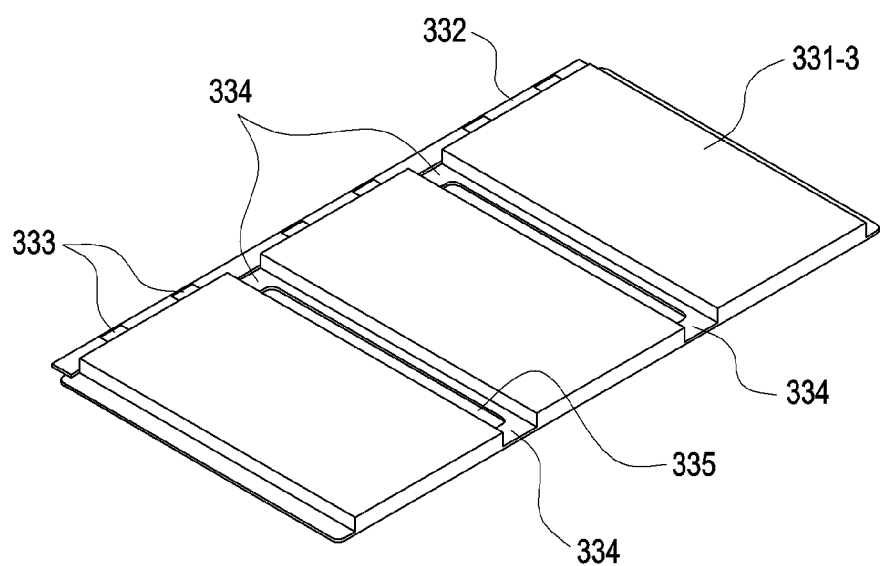
FIG. 18 is a perspective view illustrating a battery placed on a flat surface according to an embodiment of the disclosure.

FIG. 18 is a perspective view illustrating a battery placed on a flat surface according to an embodiment of the disclosure. The pouch-shaped battery 330-3 illustrated in FIG. 18 may be used for the pouch-shaped battery 330-3 and the battery cell 331-3 of FIGS. 15B, 16, 17A, and 17B, and may be wholly or partially identical to the pouch-shaped battery 330-3 and the battery cell 331-3 of FIGS. 15B, 16, 17A, and 17B.

According to various embodiments of the disclosure, the pouch-shaped battery 330-3 may be placed on a flat surface. As described above, battery cells 331-3 of the pouch-shaped battery 330-3 may be connected through the battery connection member 334. In addition, the pouch-shaped battery 330-3 may include the battery pocket opening 335 formed between a battery cell 331-3 and the battery connection member 334. The FPCB 332 may be disposed on one side of the pouch-shaped battery 330-3 to electrically connect the battery cells 331-3 to each other.

An electronic device (e.g., 300 in FIGS. 1 to 3) according to various embodiments of the disclosure may include a cover (310 in FIG. 5), a flexible display (340 in FIG. 5) at least partially disposed inside the cover, a roller (350 in FIG. 5) disposed inside the cover and configured to wind at least portion of the flexible display therearound, a bracket (320 in FIG. 5) disposed inside the cover and configured to surround at least portion of the flexible display, a battery (330 in FIG. 5) disposed between the cover and the bracket, and an FPCB (332 in FIG. 5) connected to the battery and disposed on one side of the battery. The FPCB may be electrically connected to a display driving circuit (342 in FIG. 6A) of the flexible display, disposed on the roller.

According to various embodiments of the disclosure, the battery may include at least one battery cell (331 in FIG. 5).

According to various embodiments of the disclosure, the roller may include a roller circuit (354 in FIG. 10B), and the display driving circuit may be electrically connected to the roller circuit.

According to various embodiments of the disclosure, the electronic device may further include a connection wire (e.g., 360 in FIG. 6B), and the FPCB and the display driving circuit may be electrically connected to each other through the connection wire.

According to various embodiments of the disclosure, the connection wire may include a pogo pin (361 in FIG. 10B), and the connection wire and the display driving circuit may be electrically connected to each other through the pogo pin.

According to various embodiments of the disclosure, the bracket may include at least two bracket ribs (323 in FIG. 5) formed in a longitudinal direction of the bracket, and the battery may be disposed between the bracket ribs.

According to various embodiments of the disclosure, the bracket may include a bracket opening (322 in FIG. 5) formed in a longitudinal direction of the bracket, and the cover may include a cover opening (311 in FIG. 5) formed in a longitudinal direction of the cover.

According to various embodiments of the disclosure, the flexible display may move through the bracket opening and the cover opening.

According to various embodiments of the disclosure, the roller may include a roller top fixing member (351 in FIG. 6B), a roller bottom fixing member (352 in FIG. 6B), and a roller rotation member (353 in FIG. 6B), and the roller top fixing member and the roller bottom fixing member may be fixed to the bracket or the cover.

According to various embodiments of the disclosure, at least portion of the flexible display may rotate, while being fixed to the roller rotation member.

According to various embodiments of the disclosure, the battery may include at least two battery cells (331-2 in FIG. 13), and the at least two battery cells may be arranged along a longitudinal direction of the bracket.

According to various embodiments of the disclosure, the battery cells may be connected to each other by disposing the FPCB (332-2 in FIG. 13) between the at least two battery cells arranged along the longitudinal direction of the bracket.

According to various embodiments of the disclosure, the bracket and the cover may have a cylindrical shape.

According to various embodiments of the disclosure, the bracket (320-1 in FIG. 12A) and the cover (310-1 in FIG. 12A) may have a rectangular column shape.

According to various embodiments of the disclosure, the battery may include at least one battery cell (331-1 in FIG. 12A), and the at least one battery cell may be disposed on at least one side surface of the rectangular column shape of the bracket.

An electronic device (e.g., 300-3 in FIG. 16) according to various embodiments of the disclosure may include a cover (160 in FIG. 16), a flexible display (340 in FIG. 16) at least partially disposed inside the cover, a roller (350 in FIG. 16) disposed inside the cover and winding at least portion of the flexible display therearound, a bracket (e.g., 320 in FIG. 16) disposed inside the cover and formed to surround at least portion of the flexible display, a pouch-shaped battery (330-3 in FIG. 15A) disposed between the cover and the bracket, and an FPCB (332 in FIG. 15A) connected to the pouch-shaped battery and disposed on one side of the pouch-shaped battery. The FPCB may be electrically connected to a display driving circuit (342 in FIG. 16) of the flexible display, disposed on the roller.

According to various embodiments of the disclosure, the pouch-shaped battery may include at least one battery cell (331-3 in FIG. 15A), and the battery cell may be disposed along a periphery of the bracket.

According to various embodiments of the disclosure, a battery connection member (334 in FIG. 15A) may be disposed between the at least one battery cell disposed around the periphery of the bracket.

According to various embodiments of the disclosure, the roller may include a roller circuit (354 in FIG. 10B), and the display driving circuit may be electrically connected to the roller circuit.

According to various embodiments of the disclosure, the electronic device may further include a connection wire (360 in FIG. 17A), and the FPCB and the display driving circuit may be electrically connected to each other through the connection wire.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a cover;
    a flexible display at least partially disposed inside the cover;
    a roller disposed inside the cover and configured to wind at least a portion of the flexible display therearound;
    a bracket disposed inside the cover and configured to surround at least a portion of the flexible display;
    a battery disposed between the cover and the bracket; and
    a flexible printed circuit board (FPCB) connected to the battery and disposed on one side of the battery,
    wherein the FPCB is electrically connected to a display driving circuit of the flexible display, disposed on the roller,
    wherein the bracket includes at least two bracket ribs formed in a longitudinal direction of the bracket, and
    wherein the battery is disposed between the bracket ribs.

2. The electronic device of claim 1, wherein the battery includes at least one battery cell.

3. The electronic device of claim 1,
    wherein the roller includes a roller circuit, and
    wherein the display driving circuit is electrically connected to the roller circuit.

4. The electronic device of claim 1, further comprising a connection wire,
    wherein the FPCB and the display driving circuit are electrically connected to each other through the connection wire.

5. The electronic device of claim 4,
    wherein the connection wire includes a pogo pin, and
    wherein the connection wire and the display driving circuit are electrically connected to each other through the pogo pin.

6. The electronic device of claim 1,
    wherein the bracket includes an opening formed in a longitudinal direction of the bracket, and
    wherein the cover includes a cover opening formed in a longitudinal direction of the cover.

7. The electronic device of claim 6, wherein the flexible display moves through the bracket opening and the cover opening.

8. The electronic device of claim 1,
    wherein the roller includes:
        a roller top fixing member,
        a roller bottom fixing member, and
        a roller rotation member, and
    wherein the roller top fixing member and the roller bottom fixing member are fixed to the bracket or the cover.

9. The electronic device of claim 8, wherein at least portion of the flexible display rotates, while being fixed to the roller rotation member.

10. The electronic device of claim 1,
    wherein the battery includes at least two battery cells, and
    wherein the at least two battery cells are arranged along a longitudinal direction of the bracket.

11. The electronic device of claim 10, wherein the at least two battery cells are connected to each other by disposing the FPCB between the at least two battery cells arranged along the longitudinal direction of the bracket.

12. The electronic device of claim 1, wherein the bracket and the cover have a cylindrical shape.

13. The electronic device of claim 1, wherein the bracket and the cover have a rectangular column shape.

14. The electronic device of claim 13,
    wherein the battery includes at least one battery cell, and
    wherein the at least one battery cell is disposed on at least one side surface of a rectangular column shape of the bracket.

15. An electronic device comprising:
    a cover;
    a flexible display at least partially disposed inside the cover;
    a roller disposed inside the cover and winding at least a portion of the flexible display therearound;
    a bracket disposed inside the cover and formed to surround at least a portion of the flexible display;
    a pouch-shaped battery disposed between the cover and the bracket; and
    an FPCB connected to the pouch-shaped battery and disposed on one side of the pouch-shaped battery,
    wherein the FPCB be electrically connected to a display driving circuit of the flexible display, disposed on the roller,
    wherein the bracket includes at least two bracket ribs formed in a longitudinal direction of the bracket, and
    wherein the battery is disposed between the bracket ribs.

16. The electronic device of claim 15,
    wherein the pouch-shaped battery includes at least one battery cell, and the at least one battery cell be disposed along a periphery of the bracket.

17. The electronic device of claim 16, further comprising:
    a battery connection member be disposed between the at least one battery cell disposed around the periphery of the bracket.

18. The electronic device of claim 15,
    wherein the roller include a roller circuit, and the display driving circuit be electrically connected to the roller circuit.

19. The electronic device of claim 15,
    wherein the electronic device further include a connection wire, and the FPCB and the display driving circuit be electrically connected to each other through the connection wire.

* * * * *